United States Patent
Waugh

(10) Patent No.: US 11,289,133 B2
(45) Date of Patent: Mar. 29, 2022

(54) POWER STATE BASED DATA RETENTION

(71) Applicant: ARM Limited, Cambridge (GB)

(72) Inventor: Alex James Waugh, Cambridge (GB)

(73) Assignee: Arm Limited, Cambridge (GB)

( * ) Notice: Subject to any disclaimer, the term of this patent is extended or adjusted under 35 U.S.C. 154(b) by 662 days.

(21) Appl. No.: 14/855,687

(22) Filed: Sep. 16, 2015

(65) Prior Publication Data

US 2017/0076758 A1    Mar. 16, 2017

(51) Int. Cl.
*G06F 1/3234* (2019.01)
*G06F 12/0811* (2016.01)
*G11C 5/14* (2006.01)

(52) U.S. Cl.
CPC ............ *G11C 5/148* (2013.01); *G06F 1/3275* (2013.01); *G06F 12/0811* (2013.01); *G06F 2212/1028* (2013.01)

(58) Field of Classification Search
CPC .............................. G11C 5/148; G11C 16/225
See application file for complete search history.

(56) References Cited

U.S. PATENT DOCUMENTS

| | | | | |
|---|---|---|---|---|
| 5,931,951 A * | 8/1999 | Ando | ................... | G06F 1/3228 713/324 |
| 2003/0120962 A1* | 6/2003 | Dai | ....................... | G06F 1/3203 713/320 |
| 2004/0073751 A1* | 4/2004 | Horrigan | ............. | G06F 12/0804 711/135 |
| 2006/0031835 A1* | 2/2006 | Day | ...................... | G06F 1/3203 718/100 |
| 2008/0077813 A1* | 3/2008 | Keller | .................. | G06F 1/3203 713/320 |
| 2010/0169609 A1* | 7/2010 | Finkelstein | .......... | G06F 1/3203 712/43 |
| 2010/0185821 A1* | 7/2010 | Paver | .................. | G06F 12/0888 711/146 |
| 2010/0202239 A1* | 8/2010 | Moshayedi | .............. | G11C 5/04 365/229 |
| 2010/0275049 A1* | 10/2010 | Balakrishnan | ...... | G06F 12/0846 713/324 |
| 2011/0113202 A1* | 5/2011 | Branover | ............ | G06F 12/0831 711/135 |
| 2013/0159739 A1* | 6/2013 | Bircher | ................. | G06F 1/3243 713/320 |
| 2014/0059371 A1* | 2/2014 | Kitchin | ............... | G06F 12/0804 713/323 |

(Continued)

OTHER PUBLICATIONS

Jacob et al. Memory Systems. 2008. Morgan Kaufmann. pp. 70-73, 244-249. (Year: 2008).*

(Continued)

*Primary Examiner* — Nathan Sadler
(74) *Attorney, Agent, or Firm* — Nixon & Vanderhye P.C.

(57) ABSTRACT

There is provided an apparatus comprising power state determination circuitry to determine a power state of a processing circuit; and control circuitry to issue a control signal relating to an item of data stored in a first storage circuitry. When the power state of the processing circuit is a predetermined state, the control circuitry issues a further control signal to a second storage circuitry to indicate whether the item of data is to be retained by the second storage circuitry.

13 Claims, 5 Drawing Sheets

(56) References Cited

U.S. PATENT DOCUMENTS

Figure 1:
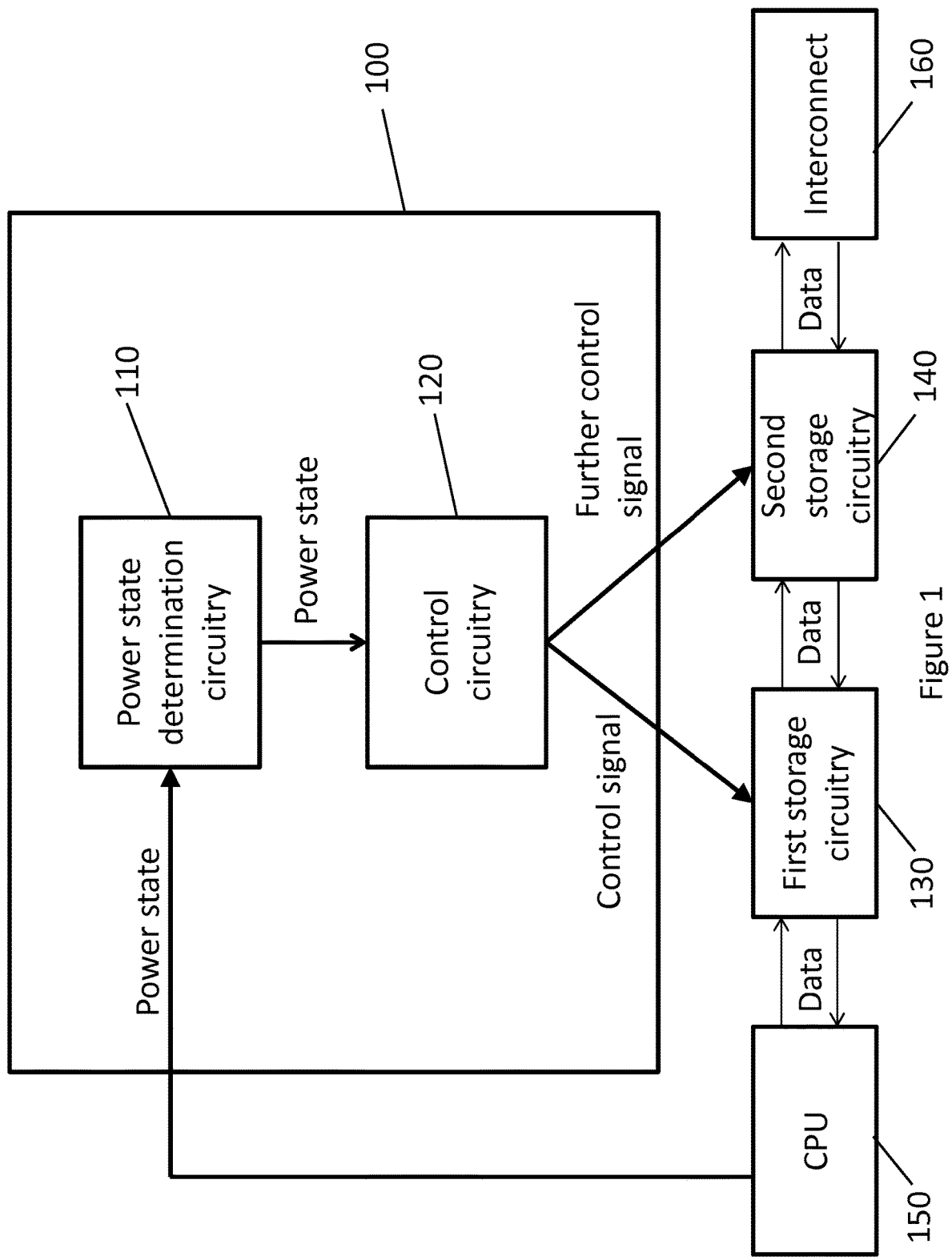

| | | | |
|---|---|---|---|
| 2014/0173207 A1* | 6/2014 | Wang | G06F 1/3243 |
| | | | 711/122 |
| 2014/0181413 A1* | 6/2014 | Manne | G06F 12/0806 |
| | | | 711/135 |
| 2014/0195737 A1* | 7/2014 | Lilly | G06F 12/0802 |
| | | | 711/122 |
| 2015/0067259 A1* | 3/2015 | Wang | G06F 12/0811 |
| | | | 711/122 |
| 2015/0081980 A1* | 3/2015 | Walker | G06F 11/073 |
| | | | 711/135 |
| 2016/0054933 A1* | 2/2016 | Haghighi | G06F 3/0611 |
| | | | 711/103 |
| 2016/0132430 A1* | 5/2016 | Nomura | G06F 12/0897 |
| | | | 711/119 |
| 2016/0203083 A1* | 7/2016 | Park | G06F 12/084 |
| | | | 711/122 |
| 2016/0283380 A1* | 9/2016 | Vinod | G06F 12/0833 |
| 2019/0004591 A1* | 1/2019 | Park | G06F 1/3225 |

OTHER PUBLICATIONS

Intel. "Energy-Efficient Platforms—Considerations for Application Software and Services." Mar. 2011. Intel. Rev. 1.0. https://www.intel.com/content/dam/doc/white-paper/energy-efficient-platforms-2011-white-paper.pdf. (Year: 2011).*

* cited by examiner

POWER STATE BASED DATA RETENTION

The present technique relates to the field of data processing, particularly the retention of data in storage circuitry.

It has previously been proposed to store data in storage circuitry, such as a cache. Where a number of storage circuits exist, it is often desirable or necessary to move or copy data from one storage circuitry to another. For example, in a cache, if data has not been accessed for a period of time then data could be moved from a higher level cache (e.g. an L1 cache) to a lower level cache (e.g. an L2 cache) to make way for more recently accessed data in the higher level cache. Similarly, in a coherent system, data could be moved or copied from the cache of one processor to the cache of another processor if the other processor wishes to access that data. There are a number of architecturally valid ways in which data can be stored in such systems. However, some ways are more efficient than others, both with respect to power consumption and with respect to the utilisation of the storage circuitry. It is therefore desirable to manage the data in such a way that both of these factors are considered.

Viewed from a first example configuration, there is provided an apparatus comprising: power state determination circuitry to determine a power state of a processing circuit; and control circuitry to issue a control signal relating to an item of data stored in a first storage circuitry, wherein when the power state of the processing circuit is a predetermined state, the control circuitry issues a further control signal to a second storage circuitry to indicate whether the item of data is to be retained by the second storage circuitry.

Viewed from a second example configuration, there is provided a method of operating an apparatus, the method comprising the steps: determining a power state of a processing circuit; and issuing a control signal relating to an item of data stored in a first storage circuitry, wherein when the power state of the processing circuit is a predetermined state, issuing a further control signal to a second storage circuitry to indicate whether the item of data is to be retained by the second storage circuitry.

Viewed from a third example configuration, there is provided an apparatus comprising: means for determining a power state of a processing circuit; and means for issuing a control signal relating to an item of data stored in a first storage circuitry and for issuing a further control signal to a second storage circuitry to indicate whether the item of data is to be retained by the second storage circuitry when the power state of the processing circuit is a predetermined state.

Figure 2:
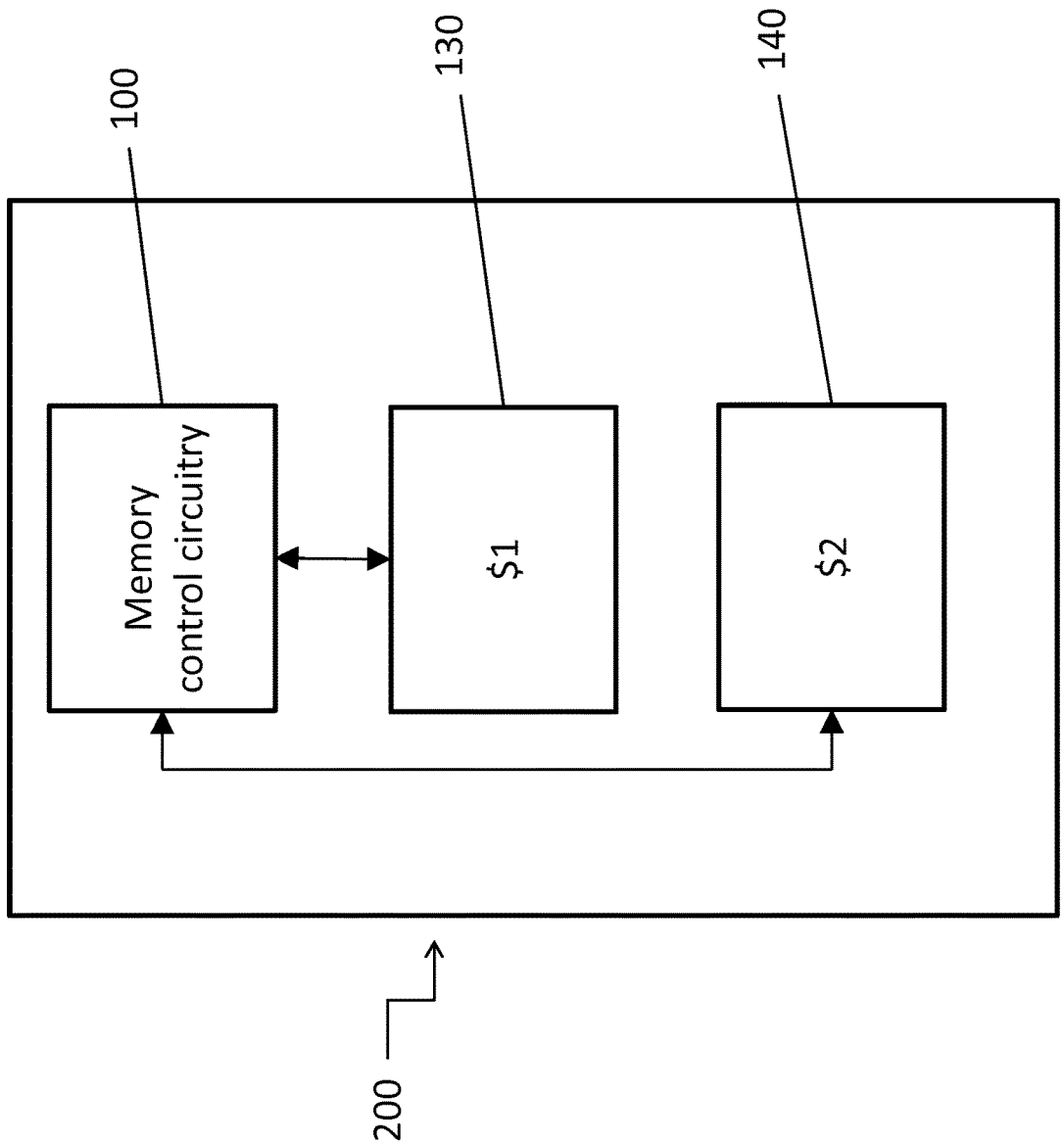
Figure 3:
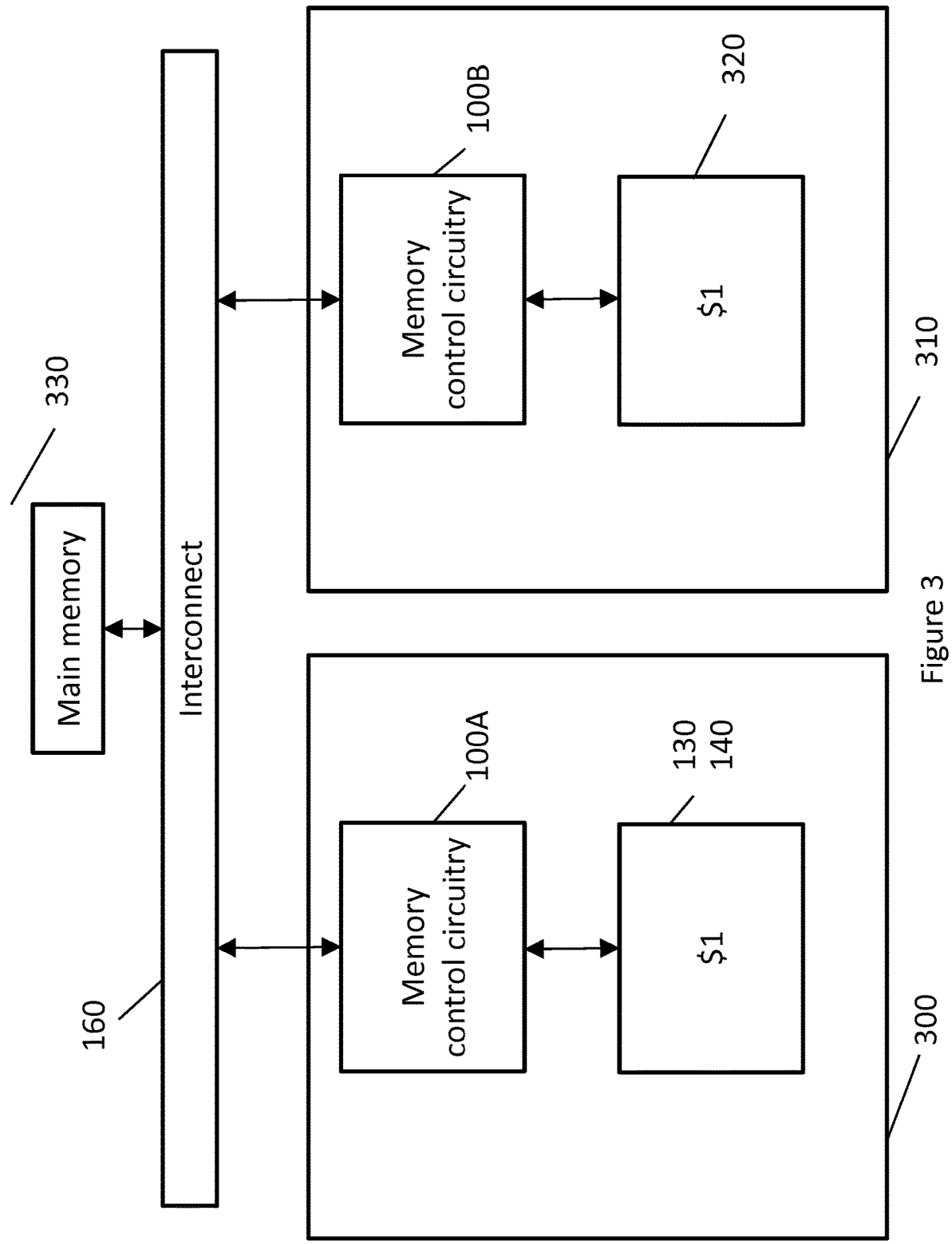
Figure 4:
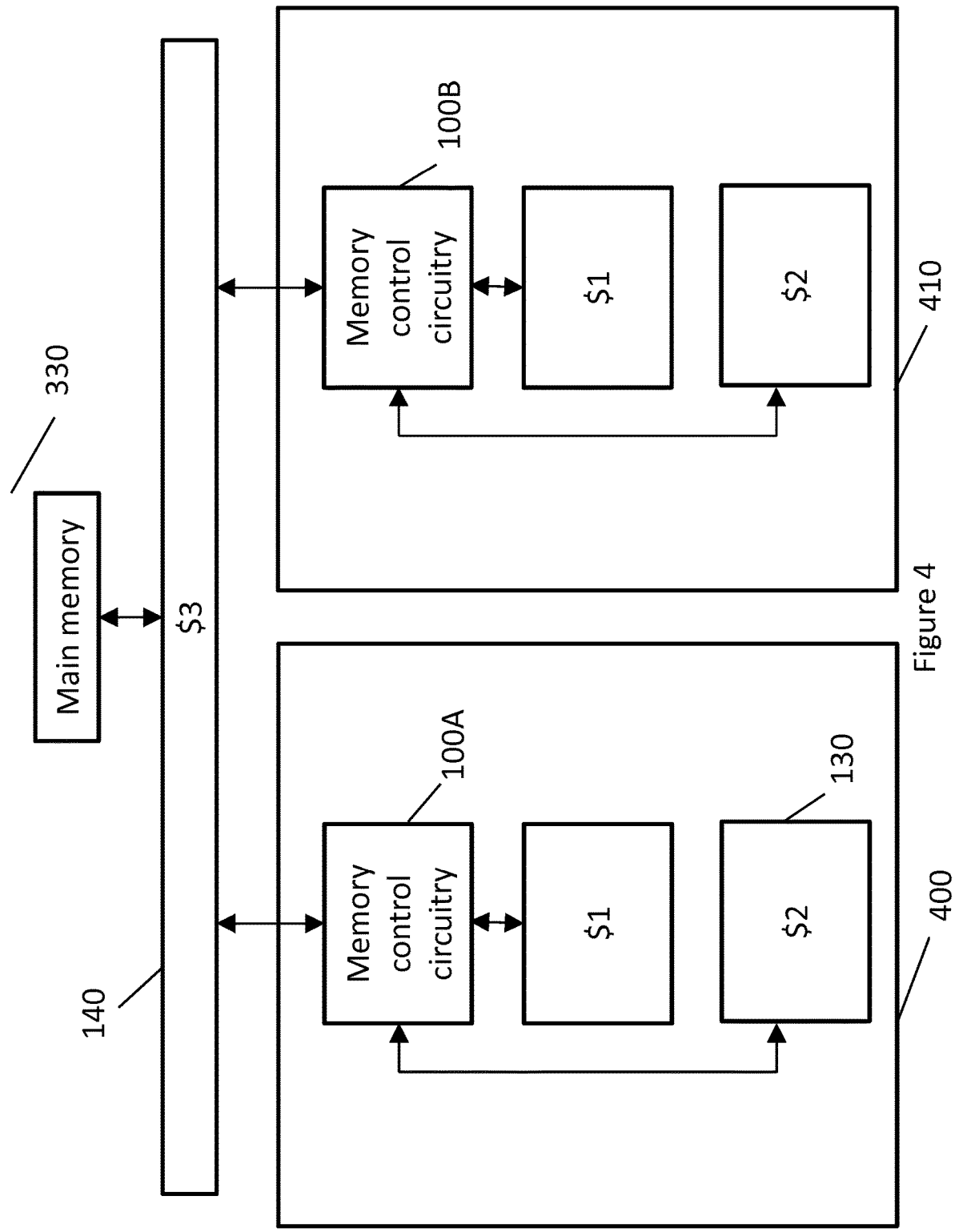
Figure 5:
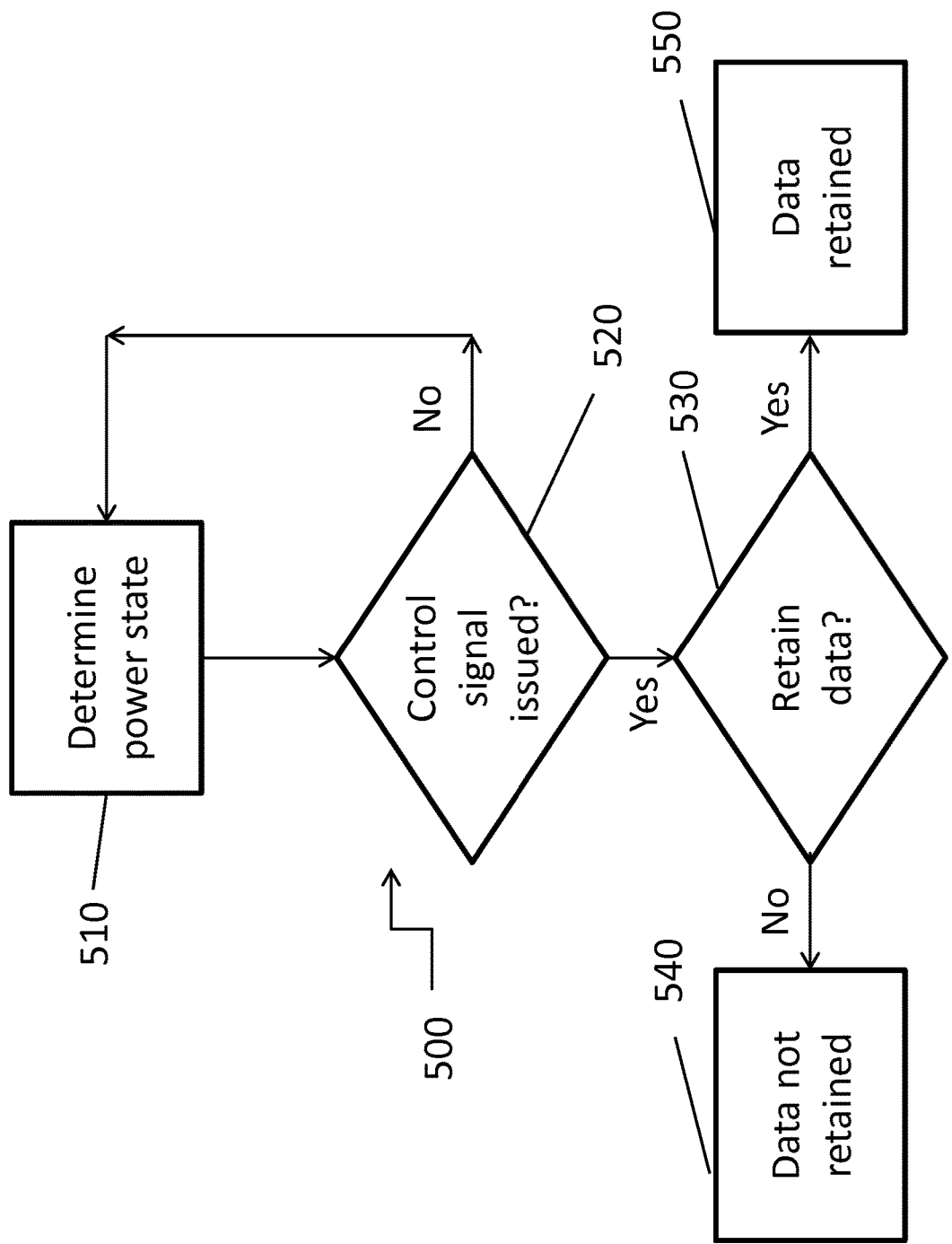

The present technique will be described further, by way of example only, with reference to embodiments thereof as illustrated in the accompanying drawings, in which:

FIG. 1 schematically illustrates apparatus in accordance with one embodiment;

FIG. 2 schematically illustrates a processing circuit comprising memory control circuitry in accordance with one embodiment;

FIG. 3 schematically illustrates a pair of processing circuits connected via an interconnect, each of the processing circuits comprising memory control circuitry in accordance with one embodiment;

FIG. 4 schematically illustrates a pair of processing circuits connected via a L3 cache, each of the processing circuits comprising memory control circuitry in accordance with one embodiment; and FIG. 5 shows a flowchart illustrating a method in accordance with one embodiment.

Before discussing the embodiments with reference to the accompanying figures, the following description of embodiments and associated advantages is provided.

In accordance with one example configuration there is provided an apparatus comprising: power state determination circuitry to determine a power state of a processing circuit; and control circuitry to issue a control signal relating to an item of data stored in a first storage circuitry, wherein when the power state of the processing circuit is a predetermined state, the control circuitry issues a further control signal to a second storage circuitry to indicate whether the item of data is to be retained by the second storage circuitry.

The control circuitry issues a control signal relating to an item of data stored in the first storage circuitry. The power state determination circuitry determines a power state of the processing circuit and if that power state is a predetermined state, then the control circuitry issues a further control signal to second storage circuitry. The further control signal indicates whether or not the item of data is to be retained by the second storage circuitry. For example, the power state of the processing circuit is a factor that determines whether or not the data is to be retained in the second storage circuitry. By considering the power state of the processing circuit when determining whether or not the data is to be retained by the second storage circuitry, it is possible to avoid the situation in which data is retained unnecessarily, thereby reducing wastage of power, reducing the wastage of processing resources and also freeing up space in the second storage circuitry where appropriate. The apparatus could be, for example, memory control circuitry, or could be processing circuit that includes such memory control circuitry.

In some embodiments values of the power state include two or more of: normal, wait for interrupt, retention, powerdown, and cluster powerdown. The normal power state corresponds with the state in which code can be executed by the processing circuit. The Wait For Interrupt (WFI) power state corresponds with a state in which the processing circuit is idle but can wake up when an interrupt arrives. The retention power state corresponds with the state in which the processing circuit is idle but is retaining state in a low-power mode. The powerdown power state corresponds with a state in which the processing circuit is powered down, but other processing circuits that make up a cluster with the processing circuit are still active (e.g. not powered down). Finally, the cluster powerdown power state corresponds with a state in which processing circuits which, together with the processing circuit, make up a cluster, are powered down. Specific embodiments may include other power states in addition to those listed here.

In some embodiments, the control signal corresponds with an operation to remove the item of data from the first storage circuitry; and the first storage circuitry and the second storage circuitry are private to the processing circuit.

In some embodiments, the further control signal indicates that the item of data is to be retained by the second storage circuitry; and the predetermined state is normal, wait for interrupt or retention. Where data is to be removed from the first storage circuitry and in a case in which the power state of the processing circuit is normal, wait for interrupt or retention (i.e. other than powerdown or cluster powerdown), there is a good chance that the data will be required again in the near future. Accordingly, it is advantageous for the data to be stored in the second storage circuitry for future access by the processing circuit.

In some embodiments, the further control signal indicates that the item of data is not to be retained by the second storage circuitry; and the predetermined state is powerdown or cluster powerdown. In a case in which the processing circuit's power state is powerdown or cluster powerdown (e.g. where the processing circuit is transitioning to a powerdown state), and the data is to be removed from the first storage circuitry, it is unlikely that there would be much value in continuing to retain the data in the second storage circuitry. In particular, if the processing circuit is powering down then it is unlikely to require the data as it is powering down. Hence, it is preferable for the data not to be retained in the second storage circuitry.

In some embodiments, the control signal corresponds with a response to a snoop operation issued from a further processing circuit, to access the item of data from the first storage circuitry; and the first storage circuitry is the second storage circuitry, which is private to the processing circuit. For example, the snoop operation may originate from the further processing circuit when that further processing circuit wishes to access particular data. In order to enable the further processing circuit to obtain the most up-to-date version of the data (and provide coherency) a snoop operation can be used to query other processing circuits to determine if they have the most up-to-date version of the data. In such cases, when a response to the snoop request is made, it is often necessary to determine whether the data that is the subject of the snoop request should be moved or copied to the requestor.

In some embodiments, the further control signal indicates that the item of data is not to be retained by the second storage circuitry; and the predetermined state is powerdown or cluster powerdown. In these embodiments, if the processing circuit is powerdown or cluster powerdown, there is little value in sharing access to the data because the processing circuit is unlikely to request access to it in the near future. Accordingly, to simplify matters of coherency between the two processing circuits, it is simpler for the processing circuit to not retain its version of the data—thereby giving exclusive access to the further processing circuit. However, in some of these embodiments, when the power state of the processing circuit is the predetermined state, the control circuitry issues a still further control signal to shared storage circuitry; the shared storage circuitry is shared by the processing circuit and the further processing circuit; and the still further control signal indicates that the item of data is to be retained by the shared storage circuitry. Accordingly, the data is not retained in storage circuitry that is private to the processing circuit, but is instead retained by shared storage circuitry. This can help to reduce ongoing coherency traffic by storing a copy of the data in shared storage circuitry that can be efficiently accessed if a processing circuit, that does not have access to the data, wants to have access to the data.

In some embodiments, the further control signal indicates that the item of data is not to be retained by the second storage circuitry; and the predetermined state is wait for interrupt or retention. When a snoop operation occurs for read access to an item of data, the processing circuit typically has two choices. It can either delete its own copy of that data and hand the data over to the further processing circuit, thereby giving the further processing circuit exclusive access to the data, or it can allow a copy of the data to be made by the further processing circuit and both it and the processing circuit will treat the data as being shared. In the latter case, if the further processing circuit subsequently wishes to change the data (i.e. to have write access to the data) then further snoop requests are likely to follow. This is undesirable if the processing circuit is in a wait for interrupt or retention state, which could require powering up the processing circuit in order to respond. Accordingly, when the power state of the processing circuit is wait for interrupt or retention, the data is not retained (thereby moving it).

In some embodiments, the predetermined state is wait for interrupt or retention; and the value of the further control signal indicates whether or not the item of data is to be retained by the second storage circuitry in further dependence on how recently the item of data has been accessed from the second storage circuitry. In such embodiments, the decision of whether to retain the data (thereby copying it) or not (thereby moving it) when the power state is WFI or retention is based on how recently the data has been accessed. This is usable as a metric for whether or not the data is likely to be used again in the future. Accordingly, if the data has been accessed recently, then it is likely to be accessed again soon and it may be preferable to make a copy of the data. Alternatively, if the data has not been accessed recently, then it is less likely to be accessed again soon and so by moving the data (no longer retaining it at the second storage circuitry), it is possible to reduce the number of incoming snoop requests that must be responded to—thereby allowing the processing circuit to remain in a low power mode undisturbed for a longer period of time.

In some embodiments, the predetermined state is wait for interrupt or retention; and the value of the further control signal indicates whether or not the item of data is to be retained by the second storage circuitry in further dependence on how long the processing circuit has had the power state. In these embodiments, the decision of whether to retain the data (thereby copying it) or not (thereby moving it) when the power state is WFI or retention is based on how long the processing circuit has been in its current power state. For example, if the processing circuit has been in its current power state for a short period of time then it might be unlikely that the processing circuit will enter a normal mode of operation soon. Therefore the data is less likely to be accessed by the processing circuit soon and so by moving the data (no longer retaining it at the second storage circuitry) it is possible to reduce the number of snoop requests that must be responded to—thereby allowing the processing circuit to remain in a low power mode undisturbed for a longer period of time.

In some embodiments, the predetermined state is normal; and the value of the further control signal indicates that the item of data is to be retained by the second storage circuitry. For example, the default may be for the item of data to be retained by the second storage circuitry unless a particular condition regarding the power state of the processing circuit is met.

In some embodiments, the control signal corresponds with an operation to remove the item of data from the first storage circuitry; the first storage circuitry is private to the processing circuit; the power state determination circuitry is to determine a power state of a plurality of processing circuits, including the processing circuit; the value of the further control signal is based on the power state of the plurality of processing circuits; and the second storage circuitry is shared by the plurality of processing circuits.

In some embodiments, the value of the further control signal indicates the item of data is not to be retained by the second storage circuitry when at least a predefined proportion of the plurality of processing circuits, including the processing circuit, have a power state of powerdown. In such embodiments, data is not stored in a shared storage circuitry if some proportion (e.g. 100%) of the processing circuits have a power state of powerdown. As more of the processing circuits acquire the power state of powerdown, it becomes less likely that a particular piece of data will be accessed because there are fewer processing circuits available to request the data. Accordingly, there may be some predefined proportion of processing circuits (such as all of them) at which it is not considered to be worthwhile storing data in the second storage circuitry that is shared by the processing circuits.

In some embodiments, the predetermined power state is cluster powerdown; and the value of the further control signal indicates the item of data is not to be retained by the second storage circuitry. Similarly to the embodiments described above, if an entire cluster is powering down, then it is unlikely that data will be required in the immediate future and so it could be reasonable to not retain that data in the second (shared) storage circuitry. Furthermore, if the data is dirty (e.g. unmodified) then this avoids allocating the data into the second storage circuitry, only for it to be written back out again as part of the powerdown process.

In some embodiments, the predetermined power state is normal, wait for interrupt or retention; and the value of the further control signal indicates that the item of data is to be retained by the second storage circuitry. Accordingly, the retention of data can correspond with either causing the data to be stored or causing the data to be kept stored if it is already stored.

In some embodiments, in response to the second storage circuitry receiving the further control signal indicating that the data is to be retained and the data being absent from the second storage circuitry, the second storage circuitry stores the data. Accordingly, when data is to be retained it is not stored then it is added to the second storage circuitry.

In some embodiments, in response to the second storage circuitry receiving the further control signal indicating that the data is not to be retained and the data being stored in the second storage circuitry, the data is removed from the second storage circuitry. Hence, when data is not to be retained, it is removed if it is already stored in the second storage circuitry.

In some embodiments, the first storage circuitry and the second storage circuitry form a cache hierarchy; and the second storage circuitry is at a higher level of the cache hierarchy than the first storage circuitry. A higher level cache in a hierarchy is typically larger and slower than a lower level cache. Accordingly, it is common for data that has not been recently used, which is stored in a lower level cache, to be moved into the higher level cache. This represents the fact that the data has not been so recently used that it is likely to be used very soon and should therefore be in the lower level cache, but that there is still a reasonable chance that it will be used again in the future, and so it is transferred into the higher level cache, where it is still more quickly accessible than, for example, data stored in main memory.

In some embodiments, the power state is an intended power state. In some embodiments, therefore, the power state can represent either the actual power state of the processing circuit, or a power state to which the processing circuit is to transition or is transitioning.

Particular embodiments will now be described with reference to the figures.

FIG. 1 shows an apparatus 100 in accordance with one embodiment. The apparatus 100 comprises a power state determination circuitry 110, which determines power state information relating to processing circuit 150. This power state information is provided to control circuitry 120. During its operation, the control circuitry 120 issues a control signal to first storage circuitry 130. If the power state information of the processing circuit 150 is a predetermined state, the control circuitry 120 issues a further control signal to second storage circuitry 140 to indicate whether data that is stored in the first storage circuitry 130 should be retained by the second storage circuitry 140. As well as the control paths, discussed above, several of the components are also connected via data paths. For example, the Central Processing Unit (CPU) 150, which is an example of the processing circuit, is connected to the first storage circuitry 130 via a data path. The first storage circuitry 130 is connected to the second storage circuitry via a data path, and the second storage circuitry is connected to the interconnect via a data path. The first storage circuitry 130 and the second storage circuitry 140 could, for example, be an L1 cache and L2 cache, respectively.

In some embodiments the apparatus 100 is a separate device to the processing circuit 150. For example, the apparatus 100 could be memory control circuitry associated with the first storage circuitry 130 and potentially the second storage circuitry 140. In other embodiments, the apparatus 100 comprises part of the processing circuit 100.

FIG. 2 illustrates a processing circuit 200 comprising a memory control circuitry 100 in accordance with one embodiment. The processing circuit comprises an L1 cache 130 (which corresponds with the first storage circuitry in this embodiment). The processing circuit 200 also comprises L2 cache 140 (which corresponds with the second storage circuitry in this embodiment). During the operation of the processing circuit 200, a control signal is issued by the memory control circuitry 100 to the L1 cache 130 to cause a cache line to be removed from the L1 cache 130. This can occur if the particular cache line has not been accessed for a period of time. In this case, under normal circumstances, the cache line or the data held within the cache line, would be stored within the L2 cache 140. This represents the fact that although the data in question has not been accessed so recently as to warrant being included in the L1 cache 130, it has still been accessed recently enough that there is deemed to be value in storing it in the L2 cache 140. By storing the data in the L2 cache 140, it cannot be accessed as quickly as if it was held in the L1 cache 130, but it can still be accessed more quickly than if the data is accessed from, for example, main memory. However, if it is likely that the line will not be used again in the near future, then it can be more efficient to not retain the data in the L2 cache 140 at all. This can result in a saving of processing resources as well as storage capacity of the L2 cache 140 as a result of causing the data to be retained in the L2 cache 140 and then subsequently removed.

In the embodiment shown in FIG. 2, possible values of the power state of the processing circuit 100 include normal, Wait For Interrupt (WFI), retention, powerdown, and cluster powerdown. The normal state represents the state in which the processing circuit 100 is executing code. The WFI state corresponds with a state where the processing circuit 100 is idle, but may wake up when an interrupt arrives. The retention state corresponds with a state where the processing circuit 100 is idle, and in a low power mode. The powerdown state corresponds with a state in which the processing circuit 100 is powered down, but other processing circuits within a cluster including the processing circuit 100 could still be active. Finally, cluster powerdown corresponds with the state where all processing circuits in the cluster are powered down.

Accordingly, if the memory control circuitry 100 determines that the power state of the processing circuit 200 is powerdown or cluster powerdown, then it is unlikely that the cache line that is removed from the L1 cache 130 will be accessed again in the near future. Consequently, in this embodiment, it is considered to be more efficient to not store this data in the L2 cache 140. In other words, the L2 cache 140 will not retain the data. However, in all other power states, no such conclusion can be reached. Accordingly, if the power state is other than powerdown or cluster powerdown, the data will be retained by the L2 cache 140. In this embodiment, the L2 cache 140 is such that, as default behaviour, it stores data that is evicted or removed from the L1 cache 130. Consequently, a further control signal must be issued in order to cause the L2 cache 140 to not retain the data. However, in other embodiments, the default behaviour of the L2 cache 140 is not to retain data. Accordingly, the further control signal must be issued when data is to be retained by the L2 cache 140.

FIG. 3 shows a first processing circuit 300 and a second processing circuit 310 each comprising memory control circuitry 100A, 100B in accordance with one embodiment. The first processing circuit comprises a private L1 cache 130, 140 (in this embodiment, the L1 cache 130, 150 of the processing circuit 300 corresponds with both the first storage circuitry 130 and the second storage circuitry 140). The second processing circuit also comprises a private L1 cache 320.

In this embodiment, the second processing circuit 310 causes a snoop request to be issued via an interconnect 160, to which the processing circuits 300, 310 and a main memory 330 are connected. The snoop request is issued because the second processing circuit 310 desires access to the most up to date version of data. In this embodiment, the first processing circuit 300 has a more recent version of the requested data in its local private L1 cache 130, 140. Accordingly, on receiving the snoop request, the memory control circuitry 100A issues a response (in this embodiment, the response to the snoop request corresponds with the control signal). The response includes the requested data. On receiving the response, the memory control circuitry 100B in the second processing circuit 310 stores the data in its own private L1 cache 320.

In such a situation, there are two possible actions that can be taken by the memory control circuitry 100A. The data can either be copied or moved from the L1 cache 130, 140 forming part of the first processing circuit 300 to the L1 cache 320 of the second processing circuit 310. In the former (copying) case, each of the processing circuits 300, 310 will treat the data as being shared. This is achieved by causing the L1 cache 130, 140 that forms part of the first processing circuit 300 to retain the data that is sent to the second processing circuit 310 in the response. In the latter (moving) case, the second processing circuit 310 obtains exclusive access to the data. This is achieved by causing the L1 cache 130, 140 that forms part of the first processing circuit 300 to not retain the data that is sent to the second processing circuit 310 in the response.

The memory control circuitry 100A determines the power state of the first processing circuit 300. If the first processing circuit 300 has a power state of cluster powerdown or powerdown, then the data will not be retained in the L1 cache 130, 140 forming part of the first processing circuit 300. This is because in such states, it is unlikely that the data will be accessed in the near future and so there is considered to be little value in continuing to store the data.

If the power state is WFI or retention, then the memory control circuitry 100A will additionally consider whether it is likely that the data will be accessed in the near future. This can be estimated based on whether the data has been recently accessed or not. If the data has been accessed recently, it can be concluded that the data is likely to be accessed again soon. Alternatively, if the data has not been accessed recently, then it can be concluded that the data is unlikely to be accessed again soon. The reasoning behind considering whether the data has been accessed recently or not relates to the consequences of sharing data rather than having exclusivity. In particular, if data is shared between multiple private caches then any time a processing circuit wishes to modify the data, that processing circuit must send a subsequent snoop request to other processing circuits in order to obtain write access to the data. Such a request cannot be responded to whilst in a low power mode. Therefore, a processing circuit that is in the WFI or retention state must wake up in order to respond. Accordingly, if the first processing circuit 300 is in a WFI or retention state, and if the data in question has not been accessed recently, then by moving the data (rather than copying it), the first processing circuit 300 can avoid receiving subsequent snoop requests in respect of that data, which will cause it to exit its low power mode. Furthermore, since the data has not been accessed recently, any impact on the first processing circuit 300 is likely to be limited. Consequently, in such situations, the data is not retained in first processing circuit's private L1 cache 130, 140. If the data has been accessed recently, then there is a reasonable chance that it will be used again soon and so the data is retained in the private L1 cache 130, 140 of the first processing circuit 300. Note that in other embodiments, if the power state is WFI or retention then the data will always be moved rather than copied (i.e. by not retaining the data in the first processing circuit's private L1 cache 130, 150). In yet other embodiments, the decision regarding whether to move or copy the data is based on how long the processing circuit 300 has had the WFI or retention power state for. In particular, if the processing circuit 300 has had the WFI or retention power state for a short period of time, then it may be concluded that it is unlikely that the processing circuit 300 will exit this power state soon, leading to the conclusion that the data is unlikely to be accessed by the processing circuit 300 soon. Accordingly, the data may be moved rather than copied in order to enable the processing circuit 300 to remain in a low power mode for longer. Conversely, if the processing circuit 300 has been in the WFI or retention power state for an extended period of time then it is more likely that the processing circuit 300 will exit this power state, and so it is more likely that the data will be accessed by the processing circuit 300 soon, thereby causing the data to be copied rather than moved.

As in the embodiment shown in FIG. 2, the memory control circuitry 100A issues the further control signal in dependence on the power state of the processing circuitry as well as the default retention behaviour of the L1 cache 130, 140.

FIG. 4 illustrates an embodiment in which two processing circuits 400, 410 each comprise memory control circuitry 100A, 100B in accordance with one embodiment. In this embodiment, the L2 cache 130 of the first processing circuit 400 is the first storage circuitry, and a shared L3 cache 140 is the second storage circuitry. The memory control circuitry 100A issues a control signal to the L2 cache 130 to remove a cache line. As previously described, this occurs as part of the natural operation of a cache. In this example, however, an even higher level of cache, L3 cache 140, exists. Accordingly, there is a question as to whether the L3 cache 140 should retain the data being evicted from the L2 cache 130 of the processing circuit 400. In this case, the memory control circuitry 100A considers the power state of the first processing circuit 400 as well as that of the second processing circuit 410. These collectively make up a cluster of processing circuits. Having considered the power states, the memory control circuitry 100A issues a further control signal to the L3 cache 140 to not retain the data if the processing circuit 400 has a power state of cluster powerdown. This is because if the entire cluster of processing circuits is being powered down, then none of the processing circuits is likely to access the data in the near future, and so there is considered to be little value in performing the additional operation to store the data in the L3 cache 140. If a proportion of the processing circuits making up the cluster of processing circuits have a power state of powerdown, then similarly the data will not be retained by the L3 cache 140. In this example, the proportion is 100%. In other words, if each of the processing circuits in the cluster has been individually powered down, then for the same reasons as for the cluster powerdown power state, it is not worth retaining the data in the L3 cache 140. In other cases, the data will be retained by the L3 cache 140.

It is worth noting that each of the embodiments previously described can be combined. In particular, the embodiment shown in FIG. 4 also comprises a pair of processing circuits 400, 410, which may issue snoop requests. Similarly, each of the processing circuits 400, 410 comprises a pair of private caches (an L1 cache and an L2 cache). Accordingly data may be moved between these private caches. Hence, the memory control circuits 100A, 100B each consider a variety of different situations and make a number of different decisions regarding the retention of data, in dependence on the control signal, and the power state of the processing circuit.

In some embodiments, when data is not to be retained in the second storage circuitry, a further control signal is issued in order to cause the data to be retained by shared storage circuitry. For example, in the embodiment shown in FIG. 4, if data is evicted from the L1 cache of the first processing circuit 400, but is not to be retained by the L2 cache of the first processing circuit 400 because the first processing circuit 400 is powering down, then a further control signal could be issued, in order to cause the data to be retained by the shared L3 cache 140. This has the advantage that the data can still be accessed more quickly than if the data was stored in main memory. Additionally, this may simplify the process of making the data available to multiple processing circuits 400, 410—for example, if the data is to be shared.

FIG. 5 illustrates a flow chart 500 in accordance with one embodiment. At step 510, a power state of the processing circuit is determined. At step 520, it is determined whether or not a control signal relating to an item of data in the first storage circuitry is issued. If not, then flow returns to step 510. In other words, step 520 provides that step 530 only proceeds in response to the aforementioned control signal being issued. At step 530, it is determined whether or not the data is to be retained in the second storage circuitry. This determination is made on the basis of the power state information that was determined in step 510. Depending on the determination, data is not retained at step 540 and data is retained at step 550. As previously explained, the retention or non-retention of data could be a default behaviour and consequently, no control signal need be issued. For example, if the default behaviour of the second storage circuitry is for data to be retained and the determination is made to retain the data, then no further control signal need be transmitted. However, if the data is not to be retained, then a further control signal must be issued to cause that data not to be retained. In other embodiments, the default behaviour is to not retain data. Accordingly, no further control signal need be issued in the event that it is determined that data should not be retained. However, a further control signal is to be issued in the event that the data is to be retained.

Note that in the preceding description, the term power state has been used. This term need not refer to the actual or current power state of the processing circuit. Instead, this may relate to the intended power state of the processing circuit, or the power state to which the processing circuit is transitioning or is about to transition.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

I claim:

1. An apparatus comprising:
   power state determination circuitry to determine a power state of a processing circuit from among a plurality of allowed power states of the processing circuit; and
   control circuitry to issue a control signal, which is an indication that an item of data in a first cache is to be subject to an eviction operation from the first cache,
   wherein,
   conditional on the power state of the processing circuit being in a retention set comprising at least one of the allowed power states, the control circuitry issues a further control signal to a second cache to indicate whether the item of data is to be retained by the second cache in response to the item of data being evicted from the first cache; and
   in response to the second cache receiving the further control signal indicating that the item of data is to be retained in the second cache and the item of data being absent from the second cache, the second cache stores the item of data.

2. An apparatus according to claim 1, wherein
   values of the power state include two or more of: normal, wait for interrupt, retention, powerdown, and cluster powerdown.

3. An apparatus according to claim 2, wherein
   the first cache and the second cache are private to the processing circuit.

4. An apparatus according to claim 3, wherein
   the retention set includes normal, wait for interrupt or retention.

5. An apparatus according to claim 3, wherein
   the retention set excludes powerdown or cluster powerdown.

6. An apparatus according to claim 2, wherein
   the first cache is private to the processing circuit;

the power state determination circuitry is to determine a power state of a plurality of processing circuits, including the processing circuit;

the control circuitry issues the further control signal based on the power state of the plurality of processing circuits; and the second cache is shared by the plurality of processing circuits.

7. An apparatus according to claim 6, wherein the control circuitry issues the further control signal to indicate that the data item should not be retained when at least a predefined proportion of the plurality of processing circuits, including the processing circuit, have a power state of powerdown.

8. An apparatus according to claim 6, wherein the retention set excludes cluster powerdown.

9. An apparatus according to claim 6, wherein the retention set includes normal, wait for interrupt and retention.

10. An apparatus according to claim 1, wherein in response to the second cache receiving the further control signal to indicate that the data item should not be retained and the data being stored in the second cache, the data is removed from the second cache.

11. An apparatus according to claim 1, wherein the first cache and the second cache form a cache hierarchy; and the second cache is at a higher level of the cache hierarchy than the first cache.

12. An apparatus according to claim 1, wherein the power state is an intended power state.

13. A method of operating an apparatus, the method comprising:

determining a power state of a processing circuit from among a plurality of allowed power states of the processing circuit; and issuing a control signal, which is an indication that an item of data in a first cache is to be subject to an eviction operation from the first cache, wherein, conditional on the power state of the processing circuit being in a retention set comprising at least one of the allowed power states, issuing a further control signal to a second cache to indicate whether the item of data is to be retained by the second cache in response to the item of data being evicted from the first cache; and in response to the second cache receiving the further control signal indicating that the item of data is to be retained in the second cache and the item of data being absent from the second cache, the second cache stores the item of data.

* * * * *